United States Patent
Arnaud et al.

(10) Patent No.: US 6,876,874 B2
(45) Date of Patent: Apr. 5, 2005

(54) PROCESS FOR REDUCING THE ELECTRICAL CONSUMPTION OF A TRANSMITTER/RECEIVER OF DIGITAL INFORMATION, IN PARTICULAR A CELLULAR MOBILE TELEPHONE, AND CORRESPONDING TRANSMITTER/RECEIVER

(75) Inventors: Thierry Arnaud, Divonne-les-Bains (FR); Friedbert Berens, Geneva (CH)

(73) Assignee: STMicroelectronics N.V., Amsterdam (NL)

(*) Notice: Subject to any disclaimer, the term of this patent is extended or adjusted under 35 U.S.C. 154(b) by 619 days.

(21) Appl. No.: 09/886,966

(22) Filed: Jun. 21, 2001

(65) Prior Publication Data
US 2002/0010010 A1 Jan. 24, 2002

(30) Foreign Application Priority Data
Jun. 28, 2000 (EP) .............................................. 00113102

(51) Int. Cl.[7] ................................................ H04B 1/38
(52) U.S. Cl. ...................................... 455/574; 455/522
(58) Field of Search .......................... 455/343.1, 343.2, 455/550.1, 571, 277.1, 277.2, 574, 522; 370/311, 330

(56) References Cited

U.S. PATENT DOCUMENTS

| 5,055,802 | A |   | 10/1991 | Hietala et al. ................. 331/16 |
| 5,111,162 | A |   | 5/1992 | Hietala et al. ............... 332/127 |
| 5,943,613 | A | * | 8/1999 | Wendelrup et al. ....... 455/343.1 |
| 5,950,120 | A | * | 9/1999 | Gardner et al. .......... 455/343.1 |

FOREIGN PATENT DOCUMENTS

| EP | 0351230 | 1/1990 | ............ H04Q/7/02 |
| EP | 0851593 | 7/1998 | ............ H04B/1/16 |
| EP | 0865167 | 9/1998 | ............ H04B/1/16 |

* cited by examiner

*Primary Examiner*—Nay Maung
*Assistant Examiner*—A Perez
(74) *Attorney, Agent, or Firm*—Lisa K. Jorgenson; Allen, Dyer, Doppelt, Milbrath & Gilchrist, P.A.

(57) ABSTRACT

The electrical consumption of a cellular mobile telephone is reduced by using fractional-division phase-locked loops receiving a frequency reference from a fairly inaccurate quartz oscillator. Electrical consumption is also reduced by switching the output of the oscillator onto the input of the processing stage when the transmission/reception stage is inactive. The fractional-division phase-locked loops can then be deactivated.

29 Claims, 3 Drawing Sheets

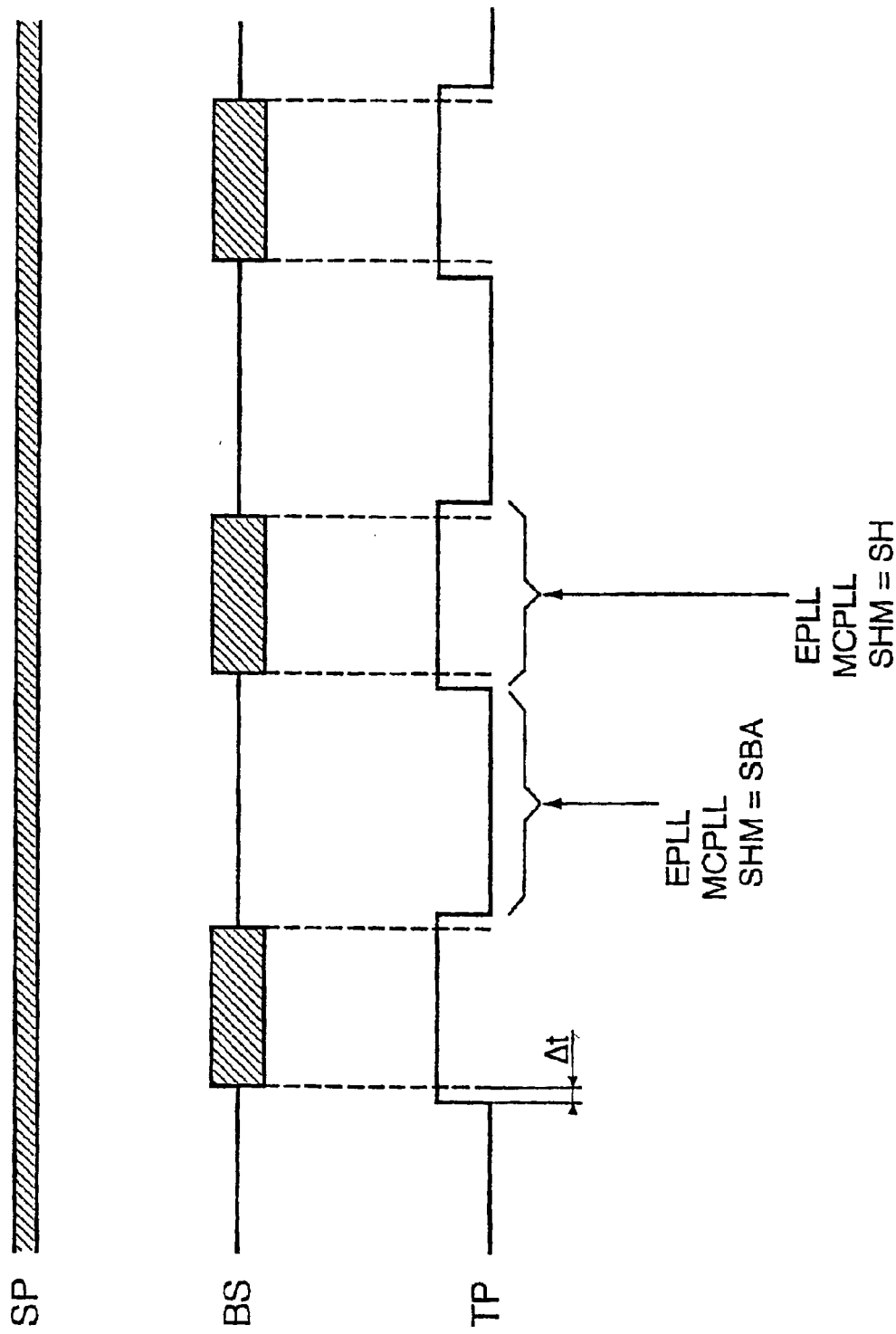

PROCESS FOR REDUCING THE ELECTRICAL CONSUMPTION OF A TRANSMITTER/RECEIVER OF DIGITAL INFORMATION, IN PARTICULAR A CELLULAR MOBILE TELEPHONE, AND CORRESPONDING TRANSMITTER/RECEIVER

FIELD OF THE INVENTION

The present invention relates to a wireless transmission of digital information, especially for a cellular mobile telephone, and in particular, a cellular mobile telephone operating according to the Universal Mobile Terrestrial Standard (UMTS) standard.

BACKGROUND OF THE INVENTION

A cellular mobile telephone has two modes of operation, an active mode and an idle mode. In the active mode, which corresponds to an exchange of dialog during the course of a communication established between the base station and the cellular telephone, the transmission and reception pathways of the telephone are both used to transfer voice or digital data between a base station and the telephone.

Outside of a telephone communication, the cellular telephone stands by in the idle mode. In the idle mode, the transmission and/or reception pathways are activated and deactivated at regular intervals to maintain a regular connection with the base station.

From a structural point of view, apart from the transmission/reception stage, which comprises the transmission pathway and the reception pathway, the cellular telephone comprises a processing stage connected to the transmission/reception stage and comprises means for digital modulation/demodulation. The means for digital modulation/demodulation may be partly provided using hard-wired logic and partly provided using software within a signal processor. This processor thus performs, in particular, the demodulation of the signal received and the modulation of the signal to be transmitted.

Moreover, various reference signals having chosen frequencies and clock signals must be generated and delivered respectively to the transmission pathway, to the reception pathway and to the modulation/demodulation processor. The frequencies of the reference signals fix or set the transmission and reception frequencies.

The various reference signals and clock signals are delivered by a frequency synthesizer stage controlled by automatic frequency control means. The accuracy required with respect of the transmission frequency is typically ±0.1 ppm for a nominal frequency in the 2 GHz range.

Currently, the internal architecture of the frequency synthesizer stage of a cellular mobile telephone is composed of conventional phase-locked loops which generate at the output of the oscillators the reference signals intended for the transmission/reception stage as well as the clock signal intended for the modulation/demodulation means.

The base signal intended for these phase-locked loops, which forms a frequency reference, is generated a controlled oscillator, such as a temperature-stable voltage-controlled oscillator (VTCXO oscillator), for example, having the required accuracy of about ±0.1 ppm. This oscillator conditions the accuracy demanded, and in particular, with respect to the transmission frequency.

On the basis of this architecture, the controlled oscillator is always operating, as is the phase-locked loop generating the clock signal for the modulation/demodulation means and the loop generating the reference signal for the transmission pathway. However, such a structure exhibits drawbacks. Specifically, not only is a controlled oscillator of this kind expensive, but its electrical consumption impairs the autonomy of the telephone.

SUMMARY OF THE INVENTION

An objective of the present invention is to optimize the electrical consumption of the transmitter/receiver (telephone) by optimizing the frequency synthesizer stage as a function of the operating mode of the cellular telephone.

A particular objective of the present invention is the generation of the various clock and synchronization signals in the various operating modes of the transmitter/receiver for reducing electrical consumption.

The invention therefore provides a process for reducing the electrical consumption of a transmitter/receiver of digital information, in particular, a cellular mobile telephone. The transmitter/receiver comprises a frequency synthesizer stage controlled by an automatic frequency control algorithm. This frequency synthesizer stage is able to deliver at least one reference signal of a chosen frequency to the transmission/reception stage of the transmitter/receiver, and a master-clock signal of a chosen frequency to the modulation/demodulation means of the transmitter/receiver.

According to a general characteristic of the invention, the reference signal or signals are generated with a predetermined accuracy (termed the transmission accuracy), typically ±0.1 ppm, on the basis of at least a first fractional-division phase-locked loop controlled by the automatic frequency control algorithm. This loop receives from a quartz oscillator, for example, a base signal having a predetermined base frequency and a base accuracy lower than the transmission accuracy. The base accuracy is typically on the order of ±10 ppm.

A clock signal is generated with a predetermined accuracy (generally also the transmission accuracy), on the basis of a second fractional-division phase-locked loop controlled by the automatic frequency control algorithm, which also receives the base signal.

When the transmission/reception stage is inactive (for example, in idle mode), the second fractional-division phase-locked loop is rendered inactive, with the base signal then being the master-clock signal. When the transmission/reception stage is active, the second loop is activated with the clock signal generated by this second loop then being the master-clock signal.

Stated otherwise, the power consumption of the telephone is reduced by using fractional-division phase-locked loops receiving a frequency reference from a fairly inaccurate quartz oscillator, and by switching the output of the oscillator onto the input of the processing stage when the transmission/reception stage is inactive. The loops may then be deactivated.

More precisely, when the transmission/reception stage, for example the transmission pathway, has to be activated in an active mode during a telephone communication or else in an idle mode at regular intervals, the modulation/demodulation means of the telephone control the second phase-locked loop (and of course the first loop or loops) by way of the automatic frequency control algorithm by demodulating a pilot signal transmitted by the base station. This is for allowing generation of a very accurate transmission reference frequency, typically ±0.1 ppm. The transmission reference frequency is intended for the transmission pathway, and the generation of the master-clock signal of the signal processor.

Conversely, when the transmission/reception stage is inactive at regular intervals during the idle mode, it is unnecessary to generate a reference signal for the transmission pathway. Only the signal processor needs to be activated. Also, in this case, it has been observed that it is unnecessary to activate the second phase-locked loop. Specifically, a master-clock signal of lower accuracy, for example ±10 ppm, proves to be quite sufficient to operate the processing stage. Also, this fairly inaccurate clock signal can then be delivered directly by a quartz reference oscillator, for example.

The invention results in particular from the observation that there exists, instants in the course of which it is unnecessary to formulate very accurate reference signals and clock signals since the transmission/reception stage, and in particular the transmission pathway, is inactive. This is so since, in the course of these instants, a clock signal of lower accuracy is sufficient to operate the processing stage.

The invention also results from the observation that when the transmission/reception stage needs to be activated, the modulation/demodulation means and the automatic frequency control algorithm can commence operating with a fairly inaccurate clock signal. This operation continues until the various fractional-division phase-locked loops are locked onto accurate frequencies with an accuracy on the order of ±0.1 ppm, following synchronization to a pilot signal.

Finally, in combination with these observations, the invention uses fractional-division phase-locked loops which exhibit the feature of being able to deliver signals at an output with very high accuracies, for example, on the order of a few hertz. This is on the basis of a base reference signal delivered, for example, by a quartz oscillator of lower accuracy than that of a VTCXO oscillator, but conversely exhibiting lower electrical consumption than that of the VTCXO oscillator.

The invention also proposes a transmitter/receiver, in particular, a cellular mobile telephone, comprising a transmission/reception stage, a processing stage connected to the transmission/reception stage and comprising modulation/demodulation means and automatic frequency control means, and a frequency synthesizer stage controlled by the automatic frequency control means for delivering at least one reference signal of a chosen frequency to the transmission/reception stage, and a master-clock signal of chosen frequency to the modulation/demodulation means.

According to a general characteristic of the invention, the frequency synthesizer stage comprises at least a first fractional-division phase-locked loop whose output, linked to the transmission/reception stage, is able to deliver with a predetermined transmission accuracy the reference signal, and a second fractional-division phase-locked loop whose output is able to deliver with a predetermined accuracy a clock signal.

Each loop is able to adopt on command an active state and an inactive state, and has a control input linked to the automatic frequency control means. Each loop also has an input for receiving a base signal emanating from an oscillator that has a predetermined base frequency and a base accuracy lower than the transmission accuracy.

The frequency synthesizer stage moreover comprises controllable switching means possessing a first state linking the output of the oscillator to the modulation/demodulation means, and a second state linking the output of the second loop to the modulation/demodulation means.

Moreover, the transmitter/receiver furthermore comprises control means for placing the second loop in an inactive state and the switching means in their first state, and to place the second loop in an active state and the switching means in their second state.

According to one embodiment of the invention, each loop is a delta-sigma modulation fractional-division phase-locked loop. This allows for a decrease in the phase noise of electrical origin and a clock accuracy on the order of a few hertz.

BRIEF DESCRIPTION OF THE DRAWINGS

Other advantages and characteristics of the invention will become apparent on examining the detailed description of modes of implementation and embodiments, which are in no way limiting, and of the appended drawings, in which:

FIG. 4 illustrates a mode of implementation of a process according to the present invention.

DETAILED DESCRIPTION OF THE PREFERRED EMBODIMENTS

Figure 1:
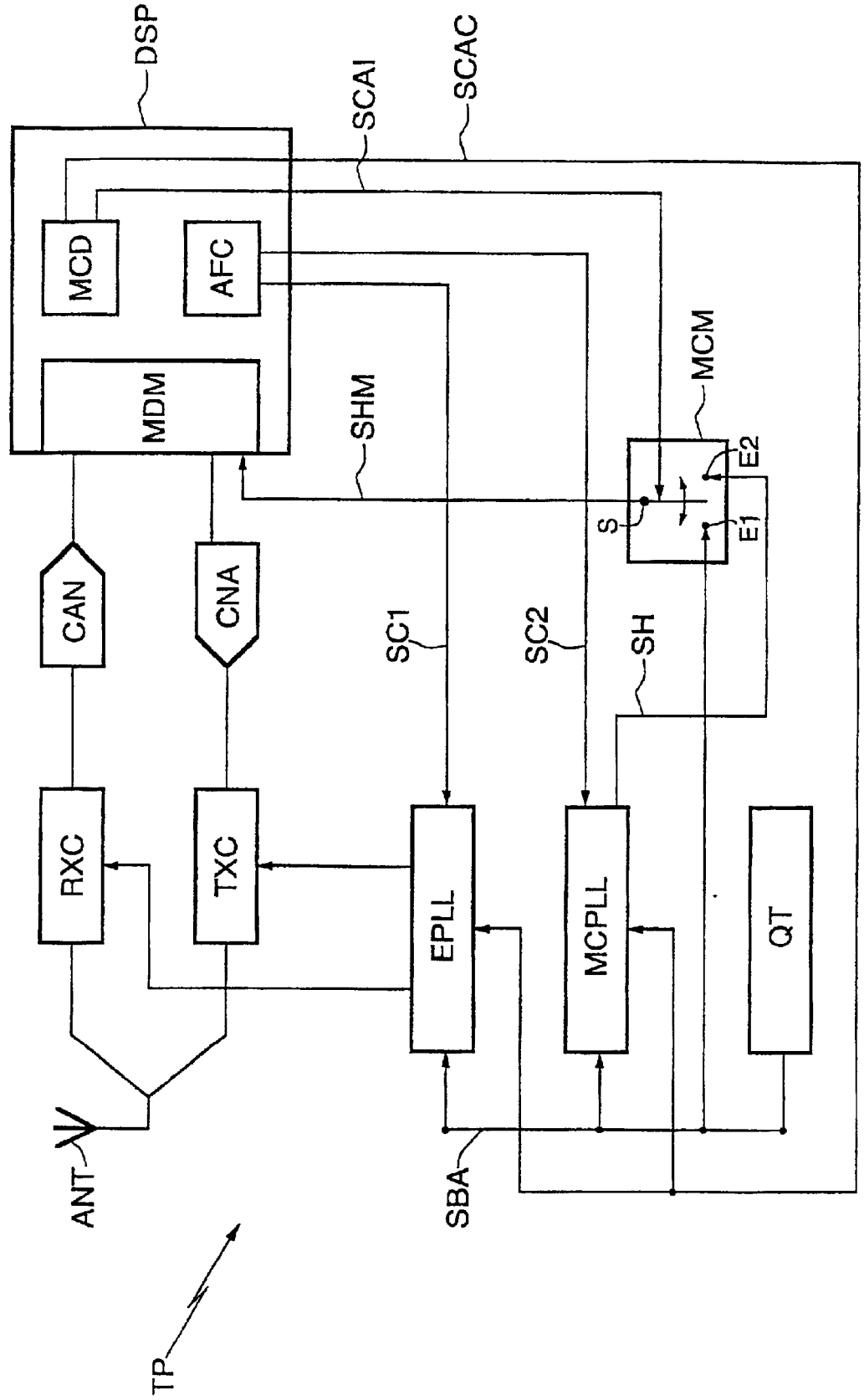
FIG. 1 is a block diagram illustrating the internal architecture of part of a cellular mobile telephone, and more particularly, the internal architecture of a frequency synthesizer stage according to the present invention.

It is now assumed, while referring to FIG. 1, that the invention applies in particular to the field of cellular mobile telephones, such as those intended to operate according to the UMTS standard, for example.

A transmitting or base station, not represented in FIG. 1 for the sake of simplification, typically comprises a coding block receiving the useful data to be transmitted, for example speech, and performs in particular channel coding processing operations which are conventional and well known to the person skilled in the art. The output of this coding block includes binary information blocks. The coding block is conventionally followed by a modulator performing, for example, a quadrature modulation of the QPSK type, according to terminology well known to the person skilled in the art, and transforms the binary signal into an analog signal. This analog signal is then filtered in a transmission filter before being transmitted towards the telephones via an antenna, after having been transposed to a radiofrequency (RF).

The cellular mobile telephone TP comprises at the front end an antenna ANT coupled to an analog transmission/reception stage which comprises a reception pathway RXC and a transmission pathway TXC. In the UMTS standard, the reception frequency can lie between 2110 and 2170 MHz, while the transmission frequency, which is different from the reception frequency, can lie between 1920 and 1980 MHz.

Moreover, one of the requirements of the UMTS standard includes high accuracy of the transmission frequency. Specifically, by way of indication, this transmission frequency must not vary by more than 0.1 ppm on either side of the nominal transmission frequency.

The transmission/reception stage is coupled in a conventional manner, by way of an analog/digital conversion stage CAN and a digital/analog CNA conversion stage, to a digital processing stage. The digital processing stage is formed partly by hard-wired logic and partly by a signal processor DSP, for example. The various functions of the DSP are then carried out in software.

Operationally, the processing stage comprises modulation/demodulation means MDM capable of performing the demodulation of the signal received and the modulation of the signal to be transmitted. This is apart from the means for estimating the impulse response of the transmission channel, means for suppressing intersymbol interference (equalizer), and a channel decoding block.

The portable telephone TP moreover comprises at least one fractional-division phase-locked loop EPLL intended to generate and deliver to the reception pathway RXC and to the transmission pathway TXC reference signals respectively having the nominal reception and transmission frequencies. In the case where the telephone comprises just a single loop EPLL directly delivering the reference signal to one of the transmission and reception pathways, there is then provided a frequency shifting means for delivering the reference signal to the other of the transmission and reception pathways on the basis of the reference signal delivered directly by the loop EPLL. Depending on the architecture used for the telephone, it is possible to provide two separate loops EPLL respectively delivering two reference signals to the transmission pathway and to the reception pathway, thus directly fixing or setting the transmission and reception frequencies.

In the subsequent text, for the sake of simplification, it will be assumed here that there is a single loop EPLL. Everything described below is also valid in the case where there are several loops EPLL. The accuracy of the reference signal delivered by the loop EPLL is controlled by a control signal SC1, which is a digital word delivered by software from the automatic frequency control AFC. More precisely, the demodulation means MDM performs a demodulation of a pilot signal transmitted by the base station on a pilot channel having a predetermined frequency and containing a predetermined code.

During demodulation of the pilot signal, the demodulator uses a master clock signal generated, as will be seen in greater detail below, by a phase-locked loop MCPLL. The frequency of this master clock signal must theoretically be a multiple of the data transmission rate on the pilot channel (chip rate). If this is not the case, during demodulation a rotation of the modulation will be observed at a frequency corresponding to the discrepancy between the theoretical transmission rate (chip rate) and the master clock signal. The automatic frequency control algorithm will then adjust the value of the control word to stop the rotation. In this case, all the phase-locked loops of the telephone will then be regarded as latched, and the various clocks will have the required accuracy.

An automatic frequency control algorithm of this kind is well known to the person skilled in the art. The latter will in particular be able to refer to the article by Aldo N. D'Andrea, entitled "Design of Quadricorrelators for Automatic Frequency Control Systems," IEEE Transactions on Communications, Vol. 41, No. 6, June 1993. In addition, reference may be made to the article by Wen-Yi Kuo, entitled "Frequency Offset Compensation of Pilot Symbol Assisted Modulation in Frequency Flat Fading," IEEE Transactions on Communications, Vol. 45, No. 11, November 1997, or the article by Bellini, entitled "Digital Frequency Estimation in Burst Mode QPSK Transmission," IEEE Transactions on Communications, Vol. 38, No. 7, July 1990.

Apart from the loop or loops EPLL, the telephone also comprises another fractional-division phase-locked loop MCPLL, whose output is linked to the second input E2 of a switching means MCM with two stages, for example, a multiplexer with two inputs and one output. The output S of the switching means MCM is linked to the modulation/demodulation means and delivers a master-clock signal SHM to these means.

The means MCM moreover comprises a first input E1 linked to the output of a quartz oscillator QT having a predetermined base frequency, for example, 20 MHZ, and a much lower accuracy than the accuracy required for the transmission frequency. In this instance, the accuracy of the quartz oscillator is on the order of ±10 ppm.

The switching means MCM are controlled by a control signal SCAI delivered by control means MCD. The control means MCD are also software means. They can also activate or disable the operation of the loops EPLL and MCPLL with another control signal SCAC.

The signal SBA emanating from the oscillator also serves as reference signal for the phase-locked loops EPLL and MCPLL. The control signal SC2, which controls the accuracy of the clock signal SH delivered by the loop MCPLL, is also delivered by the automatic frequency control means AFC and is also a digital word, which is linked in a fixed ratio to the control word SC1.

Figure 2:
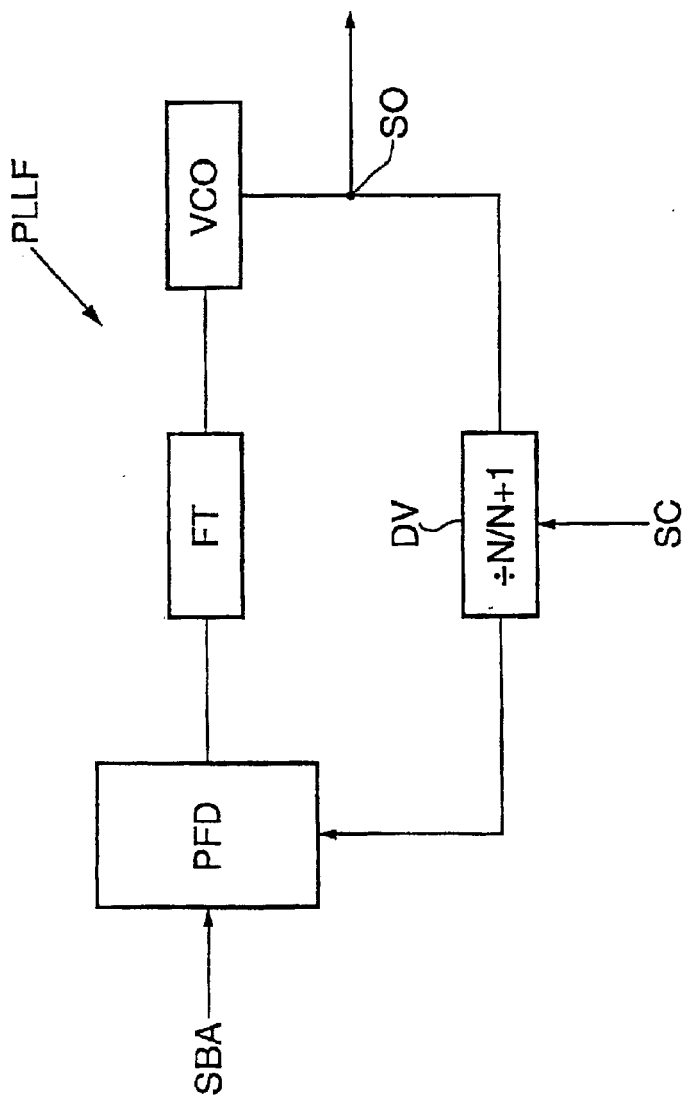
FIG. 2 is a block diagram of a fractional-division phase-locked loop according to the present invention.

The structure of a fractional-division phase-locked loop is fully known to the person skilled in the art, and the latter may in particular refer to the article entitled "Technique Enhances the Performance of PLL Synthetisers," Microwaves & RF, January 1993, pages 59–65. FIG. 2 in this article recalls the essential elements thereof.

More precisely, a fractional-division phase-locked loop PLLF comprises at the front end a phase and frequency detector PFD of conventional structure fully known to the person skilled in the art. The output of this detector PFD drives a loop filter FT whose output is linked to the input of a voltage-controlled loop oscillator VCO. The frequency of the loop oscillator VCO is substantially the output frequency desired for the output signal delivered at the output SO of the loop, which is the output of the oscillator VCO.

The output of the oscillator VCO is looped back to one of the inputs of the detector PFD by way of a fractional divider DV controlled by the control word SC emanating from the automatic frequency control means AFC. The other input of the detector PFD receives the base signal SBA emanating from the oscillator QT.

The number N is the integer closest, but less than the ratio of the frequency of the signal SBA to the frequency of the loop oscillator VCO. Moreover, the ratio of the frequency of the signal SBA to the accuracy required defines the number of bits of the control word SC. Thus, by way of example, if the output frequency of the loop needs to be equal to 2 GHz with ±0.1 ppm, this corresponds to an accuracy of 200 Hz, and if the frequency of the signal SBA is 20 MHz, the aforesaid ratio is equal to 20 MHz/200 Hz, i.e. 100,000, this lying between $2^{16}$ and $2^{17}$. The control word SC will therefore be a 17-bit word which will define the number of times that the divider DV will perform a division by N and the number of times that the divider DV will perform a division by N+1, to attain the exact ratio between the signal SBA and the output signal SO to within ±0.1 ppm.

A fractional-division phase-locked loop therefore makes it possible to obtain very good accuracy in the output frequency by using a base signal emanating from an oscillator having a much lower accuracy, and via the control of a divider with a sufficiently long digital word.

Figure 3:
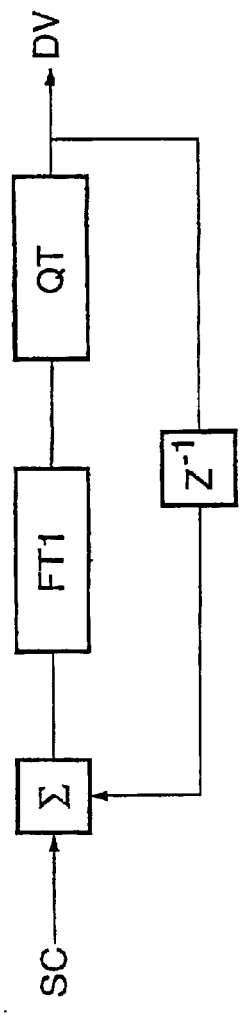
FIG. 3 illustrates an alternative embodiment using a delta-sigma modulation to control the divider of a fractional-division phase-locked loop according to the present invention.

As a variation, as illustrated in FIG. 3, the control of the divider can result from a delta-sigma modulation, also well known to the person skilled in the art. By way of indication, the control word SC arising from the means AFC drives an integrator. The output of the integrator is then delivered via a filter FT1 to the input of a quantization means QT. The output of the quantization means QT is looped back to the input of the integrator and controls the divider DV of the phase-locked loop.

Delta modulation is based on quantization of the modification of the signal sample by sample, rather than on quantization of the absolute value of the signal at each sample. The name delta-sigma is given to the modulator because of the presence of the sigma integrator. A delta-sigma modulator is designed to eliminate the quantization noise from the baseband. Control of the divider by a delta-sigma modulation allows a reduction in noise overall.

The person skilled in the art will be able to refer for greater detail regarding an exemplary delta-sigma modulation phase-locked loop to the article by Perrott, entitled "A 27-mW CMOS Fractional-N Synthesizer Using Digital Compensation for 2.5-Mb/s GFSK Modulation," IEEE Journal of Solid-State Circuits, Vol. 32, No. 12, December 1997, as well as to the above referenced article entitled "Technique Enhances the Performance of PLL Synthetisers."

The manner of operation of the frequency synthesizer stage of the telephone according to the invention will now be described in greater detail while referring more particularly to FIG. 4. In the active mode, that is to say during a communication between the base station BS and the telephone, the control means MCD activates the phase-locked loops EPLL and MCPLL and places the switching means MCM in their second state linking the second output E2 to the output S. Consequently, the master-clock signal SHM delivered to the modulation/demodulation means is the clock signal SH delivered by the loop MCPLL. That is, a multiple of the pilot signal transmission rate (chip rate), for example 15.36 MHz for a transmission rate (chip rate) equal to 3.84 Mcps as in the UMTS standard.

The accuracy of the signal SHM and of the reference signals delivered to the transmission/reception stage is then equal to ±0.1 ppm. This accuracy is controlled by the control words SC1 and SC2 through the automatic frequency algorithm. In the idle mode, as illustrated in FIG. 4, the base station BS communicates at regular intervals with the portable telephone TP, with the pilot signal SP being transmitted at all times.

Outside of the periods of dialog between the base station BS and the telephone TP, the control means MCD renders the loops EPLL and MCPLL inactive and places the switching means MCM in their first state linking the first input E1 with the output S. In this case, the master-clock signal SHM delivered to the processing stage is the base signal SBA delivered by the oscillator QT. Consequently, the processing stage, and in particular the modulation/demodulation means, receives a clock signal whose accuracy is equal to that of the oscillator QT, namely in this instance ±10 ppm. However, this accuracy is quite sufficient in the course of these periods of non-dialog.

On the other hand, just before each period of dialog between the base station BS and the portable telephone, the control means MCD renders the loops EPLL and MCPLL active and places the switching means MCM in their second state again. At the start of the activation of the loop MCPLL, the signal SHM (signal SH) is delivered with an accuracy of ±10 ppm. However, this accuracy is sufficient to allow the automatic frequency control means AFC to perform the frequency control and to deliver the control words SC1 and SC2. This is done to bring the accuracy to ±0.1 ppm at the end of the duration DT. That is, when the dialog with the base station actually commences. Typically DT may be on the order of a few microseconds depending on the architecture used. At the end of the dialog period, the control means deactivates the loops EPLL and MCPLL again and sets the switching means MCM back into their second state.

That which is claimed is:

1. A process for reducing electrical consumption of a transmitter/receiver device comprising a frequency synthesizer stage controlled by an automatic frequency control algorithm, the process comprising:

generating at least one reference signal for a transmission/reception stage within the transmitter/receive device, the at least one reference signal having a first accuracy and being generated based upon at least one first fractional-division phase-locked loop within the frequency synthesizer stage;

generating a clock signal based upon a second fractional-division phase-locked loop within the frequency synthesizer stage;

generating a base signal for the at least one first fractional-division phase-locked loop and said second fractional-division phase-locked loop, the base signal having a second accuracy less than the first accuracy; and delivering the base signal as a master-clock signal to a modulator/demodulator connected to the transmission/reception stage when the transmission/reception stage and the second fractional-division phase-locked loop are inactive, and delivering the clock signal as the master-clock signal when the transmission/reception stage and the second fractional-division phase-locked loop are active.

2. A process according to claim 1, wherein the clock signal is generated having the first accuracy.

3. A process according to claim 1, wherein the transmitter/receiver device is within a cellular mobile telephone.

4. A process for reducing electrical consumption within a transmitter/receive device, the process comprising:

generating at least one reference signal for a transmission/reception stage within the transmitter/receiver device, the at least one reference signal having a first accuracy and being generated based upon at least one first circuit;

generating a clock signal based upon a second circuit;

generating a base signal for the at least one first circuit and the second circuit, the base signal having a second accuracy less than the first accuracy; and delivering the base signal as a master-clock signal to a modulator/demodulator connected to the transmission/reception stage when the transmission/reception stage and the second circuit are inactive, and delivering the clock signal as the master-clock signal when the transmission/reception stage and the second circuit are active.

5. A process according to claim 4, wherein the clock signal is generated having the first accuracy.

6. A process according to claim 4, wherein the at least one first circuit comprises at least one phase-locked loop.

7. A process according to claim 6, wherein the at least one phase-locked loop comprises a fractional-division phase-locked loop.

8. A process according to claim 4, wherein the second circuit comprises a phase-locked loop.

9. A process according to claim 8, wherein the phase-locked loop comprises a fractional-division phase-locked loop.

10. A process according to claim 4, wherein the at least one first circuit and the second circuit are defined within a frequency synthesizer stage connected to the modulator/demodulator and the transmission/reception stage.

11. A process according to claim 4, wherein the at least one first circuit and the second circuit are controlled by an automatic frequency control algorithm.

12. A process according to claim 4, wherein the transmitter/receiver device is within a cellular mobile telephone.

13. A process for reducing electrical consumption within a transmitter/receiver device, the process comprising:

generating at least one first clock signal at a first accuracy at a first power level for a transmission/reception stage and a modulator/demodulator when the transmission/reception stage is active; and generating a second clock signal at a second accuracy less than the first accuracy and at a second power level less than the first power level for the modulator/demodulator when the transmission/reception stage is inactive.

14. A process according to claim 13, wherein generating the at least one first clock signal is generated by at least one phased-looked loop.

15. A process according to claim 14, wherein the at least one phased-locked loop comprises a fractional-division phase-locked loop.

16. A process according to claim 14, wherein the at least one phase-locked loop is inactive when the transmission/reception stage is inactive.

17. A process according to claim 13, wherein the second clock signal is generated by an oscillator.

18. A process according to claim 13, wherein the at least one first clock signal and the second clock signal are generated within a frequency synthesizer stage connected to the modulator/demodulator and the transmission/reception stage.

19. A process according to claim 13, wherein the transmitter/receiver device is within a cellular mobile telephone.

20. A transmitter/receiver device comprising:

a transmission/reception stage;

a processing stage connected to said transmission/reception stage and comprising
modulation/demodulation means, and
automatic frequency control means;

a frequency synthesizer stage controlled by said automatic frequency control means for generating at least one reference signal having a first accuracy for said transmission/reception stage, and for generating a master-clock signal to said modulation/demodulation means, said frequency synthesizer stage comprising
an oscillator for generating a base signal having a second accuracy lees then the first accuracy,
at least one first fractional-division phase-locked loop connected to said transmission/reception stage for generating the at least one reference signal, and
a second fractional-division phase-locked loop for generating a clock signal, each phase-locked loop being able to adopt on command an active state and an inactive state, and having a control input connected to said automatic frequency control means, and an input for receiving the base signal; controllable switching means having a first state for connecting said osoillator to said modulation/demodulation means with the base signal being provided as the master-clock signal, and a second state for connecting said second fractional-division phase-locked loop to said modulation/demodulation means with the clock signal being provided as the master-clock signal; and control means for placing said second fractional-division phase-locked loop in an inactive state and said controllable switching means in the first state, and for placing said second fractional-division phase-locked loop in an active state and said controllable switching means in the second state.

21. A transmitter/receiver device according to claim 20, wherein said at least one first fractional-division phase-locked loop and said second fractional-division phase-locked loop each comprises a delta-sigma modulation fractional-division phase-locked loop.

22. A transmitter/receiver device according to claim 20, wherein the transmitter/receiver device is within a cellular mobile telephone.

23. A transmitter/receiver device comprising:

a transmission/reception stage;

a modulator/demodulator connected to said transmission/reception stage; and a clock circuit for generating at least one first clock signal at a first accuracy at a first power level for said transmission/reception stage and said modulator/demodulator when said transmission/reception stage is active, and generating a second clock signal at a second accuracy less than the first accuracy and at a second power level less than the first power level for said modulator/demodulator when said transmission/reception stage is inactive.

24. A transmitter/receiver device according to claim 23, wherein said clock circuit comprises at least one phased-locked loop for generating the at least one first clock signal.

25. A transmitter/receiver device according to claim 24, wherein said at least one phased-locked loop comprises a fractional-division phase-locked loop.

26. A transmitter/receiver device according to claim 24, wherein said at least one phase-locked loop is inactive when said transmission/reception stage is inactive.

27. A transmitter/receiver device according to claim 23, wherein said clock circuit comprises an oscillator for generating the second clock signal.

28. A transmitter/receiver according to claim 23, wherein said clock circuit is within a frequency synthesizer stage connected to the modulator/demodulator and the transmission/reception stage.

29. A transmitter/receiver device according to claim 23, wherein the transmitter/receiver device is within a cellular mobile telephone.

* * * * *

UNITED STATES PATENT AND TRADEMARK OFFICE
CERTIFICATE OF CORRECTION

PATENT NO. : 6,876,874 B2
DATED : April 5, 2005
INVENTOR(S) : Arnaud et al.

It is certified that error appears in the above-identified patent and that said Letters Patent is hereby corrected as shown below:

Column 8,
Lines 16 and 41, delete "receive" insert -- receiver --

Column 9,
Line 27, delete "looked" insert -- locked --
Line 58, delete "lees" insert -- less --

Column 10,
Line 5, delete "base signal; controllable switching means" insert
-- base signal;
controllable switching means --
Line 6, delete "osoillator" insert -- oscillator --
Line 55, delete "transmitter/receiver according" insert -- transmitter/receiver device according --

Signed and Sealed this

Ninth Day of August, 2005

JON W. DUDAS
*Director of the United States Patent and Trademark Office*